United States Patent
Kim et al.

(10) Patent No.: US 12,252,773 B2
(45) Date of Patent: Mar. 18, 2025

(54) DEPOSITION MASK AND DEPOSITION APPARATUS INCLUDING THE SAME

(71) Applicant: SAMSUNG DISPLAY CO., LTD., Yongin-si (KR)

(72) Inventors: Seo Yeon Kim, Gumi-si (KR); Yoonseo Lee, Hwaseong-si (KR); Sanghoon Kim, Hwaseong-si (KR); Jongsung Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 691 days.

(21) Appl. No.: 17/501,033

(22) Filed: Oct. 14, 2021

(65) Prior Publication Data

US 2022/0187700 A1    Jun. 16, 2022

(30) Foreign Application Priority Data

Dec. 10, 2020    (KR) .................. 10-2020-0172453

(51) Int. Cl.
   *G03F 1/38*   (2012.01)
   *C23C 14/04*   (2006.01)
   *C23C 16/04*   (2006.01)
   *G03F 1/60*   (2012.01)
   *H01L 21/67*   (2006.01)
   *H01L 51/56*   (2006.01)
   *H10K 71/00*   (2023.01)
   *H10K 71/16*   (2023.01)

(52) U.S. Cl.
   CPC ........... *C23C 14/042* (2013.01); *H10K 71/00* (2023.02); *H10K 71/166* (2023.02)

(58) Field of Classification Search
   None
   See application file for complete search history.

(56) References Cited

U.S. PATENT DOCUMENTS

| | | | | |
|---|---|---|---|---|
| 8,631,761 | B2* | 1/2014 | Kang | C23C 14/042 |
| | | | | 118/721 |
| 8,701,592 | B2* | 4/2014 | Ko | C23C 14/042 |
| | | | | 118/301 |
| 8,707,894 | B2* | 4/2014 | Lee | C23C 14/042 |
| | | | | 118/504 |
| 9,450,185 | B2 | 9/2016 | Kang | |
| 9,745,657 | B2* | 8/2017 | Kim | C23C 16/042 |
| 10,439,170 | B2* | 10/2019 | Lin | H10K 71/00 |
| 10,920,311 | B2* | 2/2021 | Kudo | B23K 11/11 |

(Continued)

FOREIGN PATENT DOCUMENTS

| | | |
|---|---|---|
| JP | 2020019998 A2 | 2/2020 |
| KR | 10-2003-0074227 | 9/2003 |

(Continued)

*Primary Examiner* — Jethro M. Pence
(74) *Attorney, Agent, or Firm* — F. CHAU & ASSOCIATES, LLC

(57) ABSTRACT

A deposition mask includes a body portion, a pattern portion that penetrates the body portion and is configured to allow deposition material to pass through the body portion, a blocking portion disposed on the body portion, and a support portion disposed on the body portion adjacent to the blocking portion. The blocking portion contacts a display substrate, blocks the deposition material, and defines the pattern portion. The support portion contacts the display substrate.

11 Claims, 11 Drawing Sheets

(56) References Cited

U.S. PATENT DOCUMENTS

| | | | |
|---|---|---|---|
| 11,279,999 B2* | 3/2022 | Aoki | C23C 14/24 |
| 11,414,739 B2* | 8/2022 | Lin | C23C 14/12 |
| 11,434,559 B2* | 9/2022 | Aoki | C23C 14/24 |
| 11,732,347 B2* | 8/2023 | Okamoto | C23C 14/042 |
| | | | 118/712 |
| 11,781,210 B2* | 10/2023 | Hong | B05C 21/005 |
| | | | 118/504 |
| 11,864,453 B2* | 1/2024 | Moon | C23C 14/24 |
| 11,885,006 B2* | 1/2024 | Moon | C23C 14/12 |
| 11,937,492 B2* | 3/2024 | Lee | G03F 7/0015 |
| 11,974,483 B2* | 4/2024 | Kim | H10K 59/873 |
| 2010/0055810 A1* | 3/2010 | Sung | H10K 50/11 |
| | | | 438/22 |
| 2010/0206222 A1* | 8/2010 | Sung | C23C 16/042 |
| | | | 118/69 |
| 2012/0279444 A1* | 11/2012 | Hong | C23C 16/042 |
| | | | 118/504 |
| 2013/0276701 A1* | 10/2013 | Sonoda | C23C 16/4401 |
| | | | 118/715 |
| 2014/0130733 A1* | 5/2014 | Han | C23C 14/042 |
| | | | 118/504 |
| 2014/0331925 A1* | 11/2014 | Han | C23C 14/042 |
| | | | 118/504 |
| 2015/0007768 A1* | 1/2015 | Lee | H10K 71/00 |
| | | | 118/504 |
| 2016/0005970 A1* | 1/2016 | Kwen | H10K 71/00 |
| | | | 118/504 |
| 2016/0079532 A1* | 3/2016 | Yi | C23C 14/042 |
| | | | 438/758 |
| 2022/0290288 A1* | 9/2022 | Hong | H10K 71/166 |
| 2023/0160054 A1* | 5/2023 | Moon | C23C 14/12 |
| | | | 118/504 |

FOREIGN PATENT DOCUMENTS

| | | |
|---|---|---|
| KR | 10-2006-0106146 | 10/2006 |
| KR | 10-0647663 | 11/2006 |
| KR | 10-2014-0099127 A | 8/2014 |
| KR | 10-2017-0128863 | 11/2017 |
| KR | 10-1918561 | 2/2019 |

* cited by examiner

DEPOSITION MASK AND DEPOSITION APPARATUS INCLUDING THE SAME

CROSS-REFERENCE TO RELATED APPLICATION(S)

This application claims priority under 35 U.S.C. § 119 from Korean Patent Application No. 10-2020-0172453, filed on Dec. 10, 2020 in the Korean Intellectual Property Office (KIPO), the contents of which are herein incorporated by reference in their entirety.

1. TECHNICAL FIELD

Embodiments of the disclosure are generally directed to a deposition mask and deposition apparatus that includes the deposition mask.

2. DISCUSSION OF THE RELATED ART

An organic light emitting display device includes a plurality of organic light emitting diodes, and an organic light emitting diode has a structure in which several layers of thin films made of an organic material are disposed between a first electrode, such as an anode electrode, and a second electrode, such as a cathode electrode. The thin film may include a hole injection layer, a hole transport layer, an emission layer, an electron transport layer, and an electron injection layer. To form the thin film and the second electrode, a deposition process is performed with a deposition mask in which a deposition material is deposited on a substrate.

The types of deposition masks used in such a deposition process include a fine metal mask (FMM) and an open mask. When precisely depositing the deposition material to form the emission layer, a fine metal mask is used. When the deposition material is deposited over the entire display area to form the hole injection layer, the hole transport layer, the electron transport layer, the electron injection layer, and the second electrode, an open mask that has an opening corresponding to the display area is used. For example, an open mask includes a body portion that blocks the deposition material and a pattern portion that penetrates the body portion.

In addition, a shadow may form on the substrate in an area in which the pattern portion and the body portion are adjacent to each other. For example, the deposition material may be sprayed outside of the pattern portion and an external shadow may be formed. A process margin that corresponds to the external shadow should be secured, which increases the bezel of the organic light emitting display device.

SUMMARY

Some embodiments provide a deposition mask.

Some embodiments provide a deposition apparatus that includes a deposition mask.

A deposition mask according to an embodiment includes a body portion, a pattern portion that penetrates the body portion and is configured to allow deposition material to pass through the body portion, a blocking portion disposed on the body portion, where the blocking portion contacts a display substrate, blocks the deposition material, and defines the pattern portion, and a support portion disposed on the body portion and adjacent to the blocking portion, where the support portion contacts the display substrate, and.

According to an embodiment, the blocking portion surrounds the pattern portion.

According to an embodiment, the deposition material is not deposited on a portion of the display substrate that overlaps the blocking portion.

According to an embodiment, the blocking portion and the body portion that overlap the blocking portion have a tapered sidewall.

According to an embodiment, the blocking portion is integrally formed with the body portion.

According to an embodiment, the blocking portion includes at least one of stainless steel ("SUS"), Invar alloy, nickel ("Ni"), cobalt ("Co"), a nickel alloy, or a nickel-cobalt alloy.

According to an embodiment, the support portion supports the display substrate together with the blocking portion.

According to an embodiment, the display substrate includes a base substrate, a lower structure disposed on the base substrate, and a spacer that protrudes from the base substrate. The support portion contacts the spacer.

According to an embodiment, a first height of the blocking portion is equal to a second height of the support portion.

According to an embodiment, a sum of the first height and a third height from the base substrate to the lower structure is equal to a sum of the second height and a fourth height of the spacer.

According to an embodiment, the support portion is integrally formed with the body portion and the blocking portion.

According to an embodiment, the support portion includes at least one of stainless steel ("SUS"), Invar alloy, nickel ("Ni"), cobalt ("Co"), a nickel alloy, or a nickel-cobalt alloy.

A deposition mask according to another embodiment includes a body portion, a plurality of pattern portions that penetrate the body portion and are configured to allow a deposition material to pass through the body portion, a plurality of blocking portions disposed on the body portion, wherein each of the plurality of blocking portions contacts a display substrate, blocks the deposition material, and defines the pattern portions, and a plurality of support portions disposed on the body portion, wherein each of the plurality of support portions contacts the display substrate and is disposed between adjacent blocking portions of the plurality of blocking portions.

According to an embodiment, each of the plurality of blocking portions surrounds a corresponding pattern portion of the plurality of pattern portions.

According to an embodiment, the plurality of body portions, the plurality of blocking portions, and the plurality of support portions are integrally formed.

According to an embodiment, the plurality of support portions support the display substrate together with the plurality of blocking portions.

A deposition apparatus according to an embodiment includes a chamber, a deposition mask disposed in the chamber, and a deposition source that faces the deposition mask. The deposition source is configured to deposit a deposition material on a display substrate by spraying the deposition material to the deposition mask. The display substrate includes a display area and a circuit area adjacent to the display area. The deposition mask include a body portion, a pattern portion that overlaps the display area and penetrates the body portion, where the pattern portion is configured to pass the deposition material, a blocking portion disposed on the body portion, where the blocking portion contacts the display substrate in the circuit area, and a support portion disposed on the body portion and adjacent to the blocking portion, where the support portion contacts the display substrate.

According to an embodiment, the blocking portion and the body portion that overlaps the blocking portion have a tapered sidewall.

According to an embodiment, the blocking portion surrounds the pattern portion.

According to an embodiment, the display substrate includes a base substrate in which the display area and the circuit area are defined; a first transistor disposed on the base substrate and that overlaps the display area; a second transistor disposed on the base substrate and that overlaps the circuit area; and a first electrode disposed on the first transistor and that is electrically connected to the first transistor.

DETAILED DESCRIPTION

Illustrative, non-limiting embodiments will be more clearly understood from the following detailed description in conjunction with the accompanying drawings.

Figure 1:
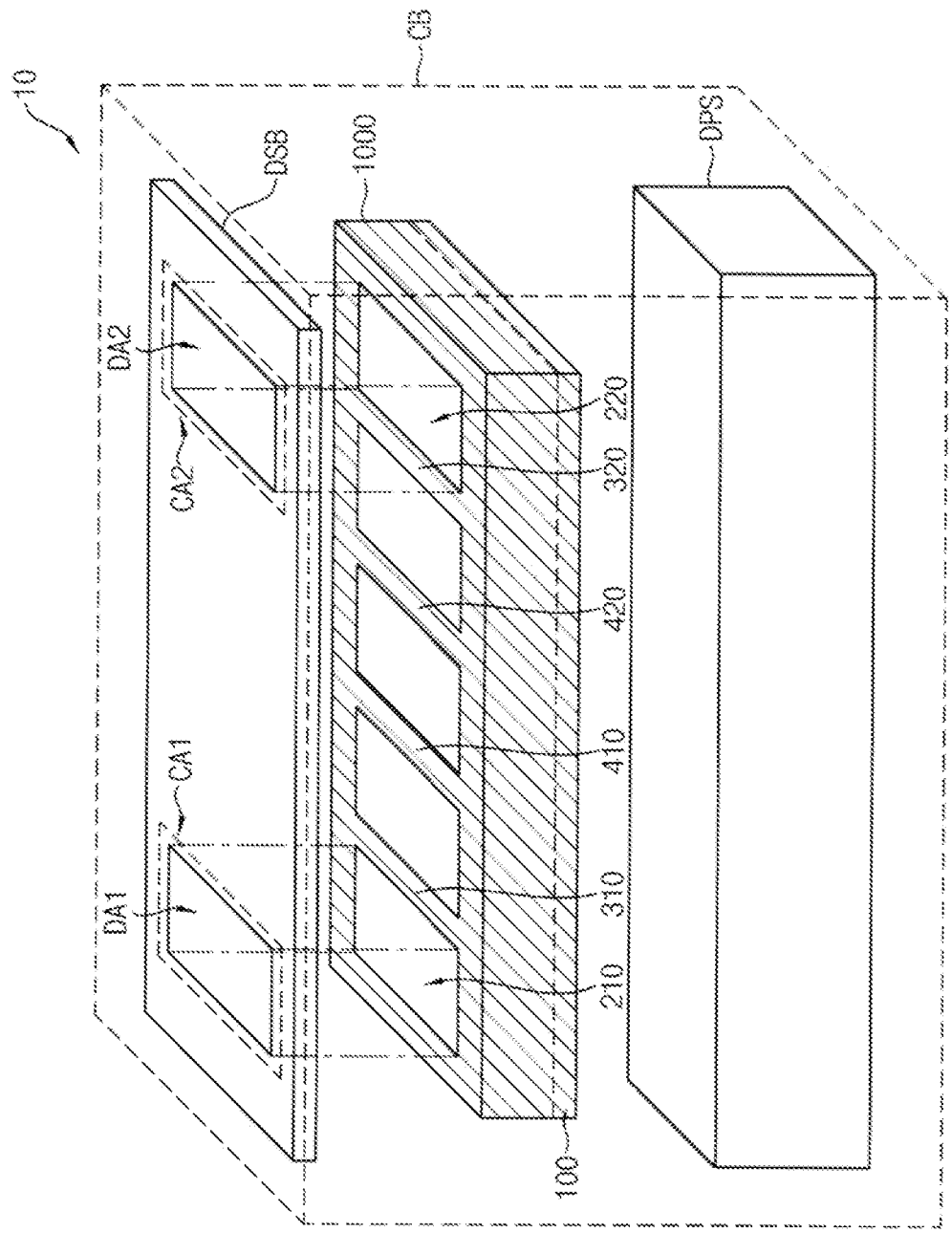
FIG. 1 is a perspective view of a deposition apparatus according to an embodiment.
Figure 2:
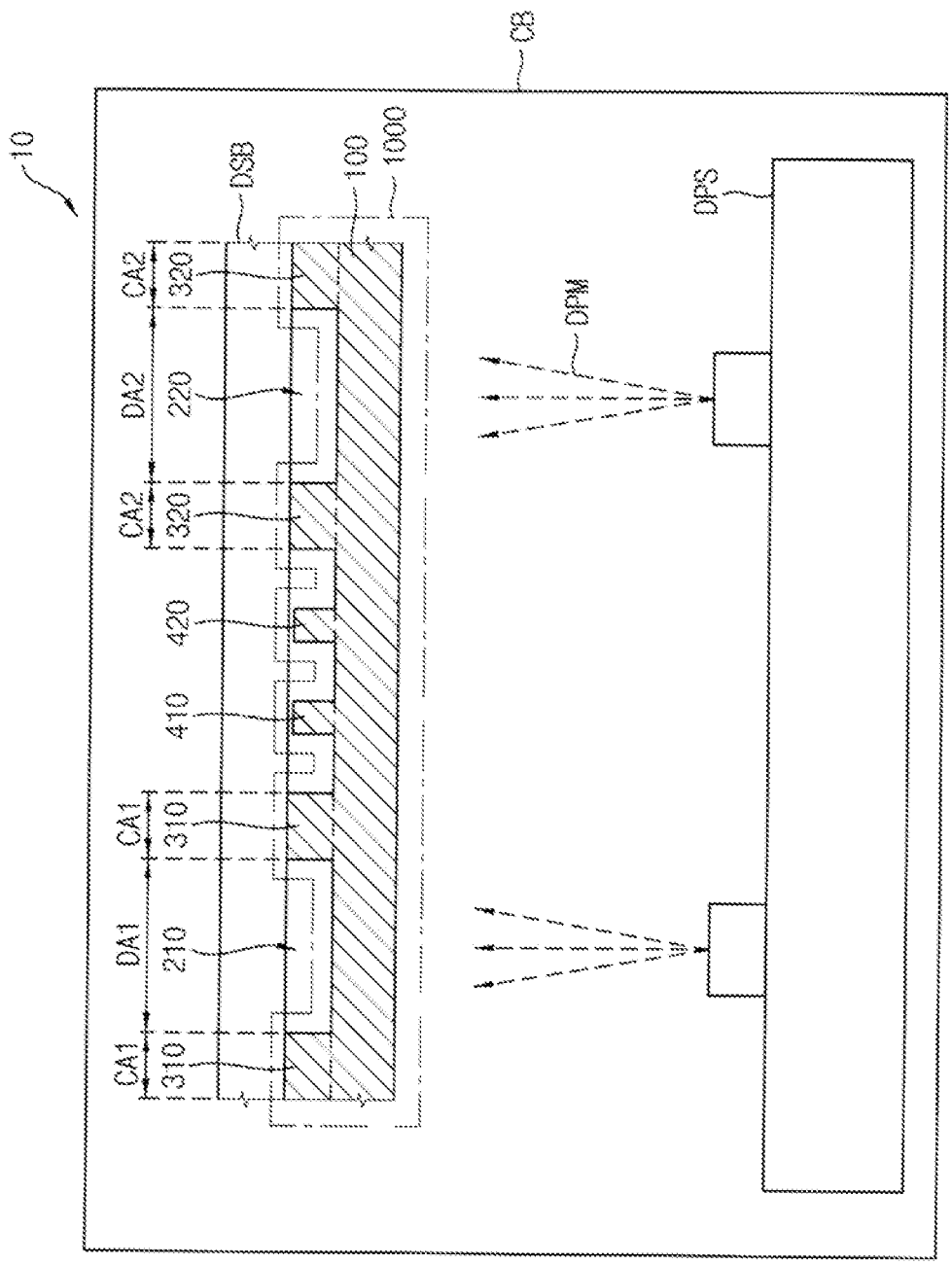
FIG. 2 is a cross-sectional view of a deposition apparatus of FIG. 1.
Figure 3:
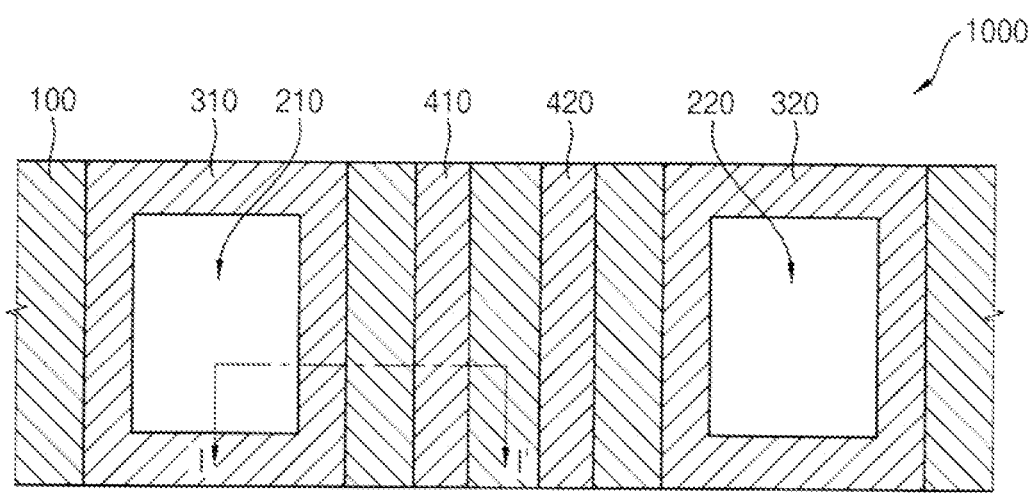
FIG. 3 is a plan view of a deposition mask included in a deposition apparatus of FIG. 1.

FIG. 1 is a perspective view of a deposition apparatus according to an embodiment. FIG. 2 is a cross-sectional view of a deposition apparatus of FIG. 1. FIG. 3 is a plan view of a deposition mask in an deposition apparatus of FIG. 1.

Referring to FIGS. 1 and 2, a deposition apparatus 10 includes a chamber CB, a deposition mask 1000, and a deposition source DPS.

In an embodiment, the deposition mask 1000 is disposed inside the chamber CB. The deposition source DPS is disposed inside the chamber CB, and faces the deposition mask 1000. The deposition source DPS sprays a deposition material DPM to the deposition mask 1000, and the deposition mask 1000 partially blocks the deposition material DPM. In other words, some deposition material DPM passes through the deposition mask 1000. Accordingly, the deposition mask 1000 and the deposition source DPS partially deposit the deposition material DPM on a display substrate DSB.

In an embodiment, the display substrate DSB is a mother substrate for manufacturing a display device. In an embodiment, the display substrate DSB includes a plurality of display areas and a plurality of circuit areas adjacent to the display areas. For example, the display substrate DSB includes a first display area DA1, a second display area DA2, a first circuit area CA1, and a second circuit area CA2. The first circuit area CA1 is adjacent to the first display area DA1. For example, the first circuit area CA1 surrounds the first display area DAL The second circuit area CA2 is adjacent to the second display area DA2. For example, the second circuit area CA2 surrounds the second display area DA2.

In an embodiment, the first display area DA1 and the first circuit area CA1 corresponds to one display device. For example, a plurality of pixels are disposed in the first display area DA1, and a driver, such as a gate driver, electrically connected to the pixels is disposed in the first circuit area CAL However, embodiments of the present disclosure are not limited thereto. In an embodiment, the first display area DA1 and the first circuit area CA1 correspond to one pixel. For example, the first display area DA1 corresponds to an emission area of the pixel, and the first circuit area CA corresponds to a non-emission area adjacent to the emission area.

Referring to FIGS. 1, 2, and 3, in an embodiment, the deposition mask 1000 includes a body portion 100, a plurality of pattern portions, a plurality of blocking portions, and a plurality of support portions. For example, the deposition mask 1000 includes a body portion 100, a first pattern portion 210, a second pattern portion 220, a first blocking portion 310, and a second blocking portion 320, a first support portion 410, and a second support portion 420. The first and second pattern portions 210 and 220 penetrate the body portion 100 and pass the deposition material DPM, i.e., allows the deposition material to pass therethrough. Accordingly, the deposition mask 1000 functions as an open mask.

In an embodiment, the body portion 100 is a skeleton for the deposition mask 1000. In an embodiment, the body portion 100 faces the display substrate DSB and is spaced apart from the display substrate DSB. The body portion 100 blocks the deposition material DPM.

In an embodiment, the body portion 100 includes a rigid metal. For example, the body part 100 includes at least one of stainless steel ("SUS"), Invar alloy, nickel ("Ni"), cobalt ("Co"), a nickel alloy, or a nickel-cobalt alloy.

In an embodiment, the first pattern part 210 penetrates the body part 100. Accordingly, the deposition material DPM passes through the first pattern portion 210. In other words, the first pattern portion 210 passes the deposition material DPM. In an embodiment, the first pattern portion 210 defines a first deposition area in the display substrate DSB in which the deposition material DPM is deposited. For example, the first deposition area is the first display area DA1. In other words, the first pattern portion 210 overlaps the first display area DA1.

Figure 8:
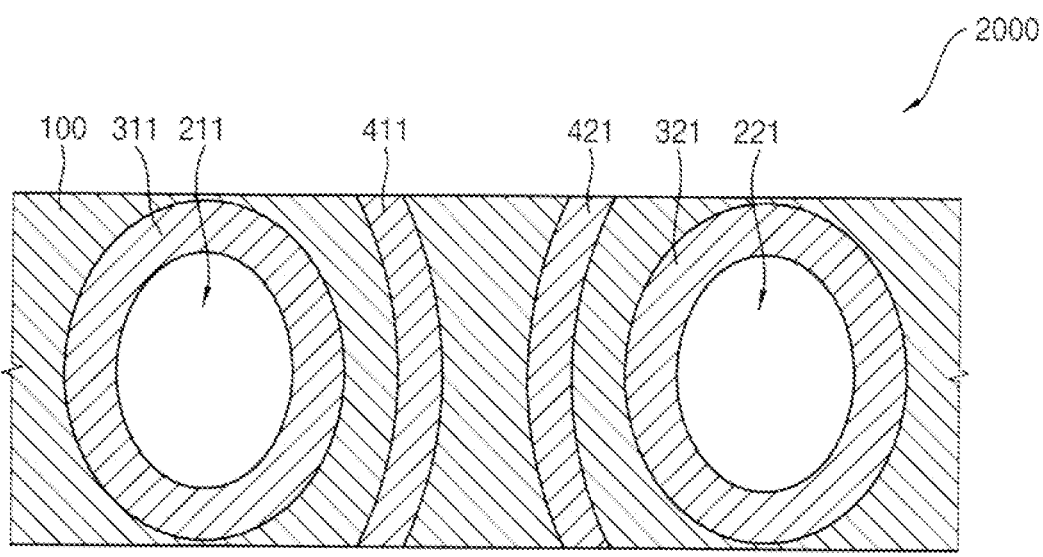
FIG. 8 is a plan view of another deposition mask included in a deposition apparatus of FIG. 1.

Hereinafter, an embodiment in which the first deposition area is the first display area DA1 and the second deposition area is the second display area DA2 is described, but embodiments of the present disclosure are not limited thereto. For example, the deposition areas can be set as needed. In addition, although the first pattern portion 210 has a rectangular shape as shown in FIG. 3, embodiments of the present disclosure are not limited thereto. For example, the first pattern portion 210 can have a circular shape, as shown in FIG. 8, or a rectangular shape with rounded corners.

In an embodiment, the second pattern portion 220 is spaced apart from the first pattern portion 210, and has a shape that is substantially the same as a shape of the first pattern portion 210.

In an embodiment, the first blocking portion 310 is disposed on the body portion 100. For example, the first blocking portion 310 protrudes from the body portion 100. In an embodiment, the first blocking portion 310 contacts the display substrate DSB. For example, the first blocking portion 310 contacts the display substrate DSB in the first circuit area CA1 of the display substrate DSB. As the first blocking portion 310 contacts the display substrate DSB in the first circuit area CA1, the deposition material DPM directed to the first circuit area CA1 is blocked.

In an embodiment, the first blocking portion 310 is integrally formed with the body portion 100. For example, the first blocking portion 310 includes at least one of stainless steel ("SUS"), Invar alloy, nickel ("Ni"), cobalt ("Co"), a nickel alloy, or a nickel-cobalt alloy.

In an embodiment, the first blocking portion 310 defines the first pattern portion 210. For example, the first blocking portion 310 surrounds the first pattern portion 210. The first blocking portion 310 has a shape that corresponds to a shape of the first pattern portion 210. For example, as shown in FIG. 3, the first blocking portion 310 has a rectangular shape. However, embodiments are not limited thereto, and in other embodiments, the first blocking portion 310 may have a circular shape or a rectangular shape with rounded corners.

In an embodiment, the second blocking portion 320 is spaced apart from the first blocking portion 310, and has a shape that is substantially the same as that of the first blocking portion 310.

In an embodiment, the first support portion 410 is disposed on the body portion 100. For example, the first support portion 410 protrudes from the body portion 100. In an embodiment, the first support portion 410 contacts the display substrate DSB. Accordingly, the first support portion 410 supports the display substrate DSB together with the first blocking portion 310.

In an embodiment, the first support portion 410 is integrally formed with the body portion 100. For example, the first blocking portion 310 includes at least one of stainless steel ("SUS"), Invar alloy, nickel ("Ni"), cobalt ("Co"), a nickel alloy, or a nickel-cobalt alloy.

In an embodiment, the first support portion 410 is disposed between the first blocking portion 310 and the second blocking portion 320. In addition, the second support portion 420 is disposed between the first support portion 410 and the second blocking portion 320.

In an embodiment, the first and second support portions 410 and 420 are disposed between the first and second blocking portions 310 and 320 and contact the display substrate DSB. The first and second support portions 410 and 420 support the display substrate DSB together with the first and second blocking portions 310 and 320. Accordingly, pressure applied to the first and second circuit areas CA1 and CA2 that contact the first and second blocking portions 310 and 320 can be reduced.

Figure 4:
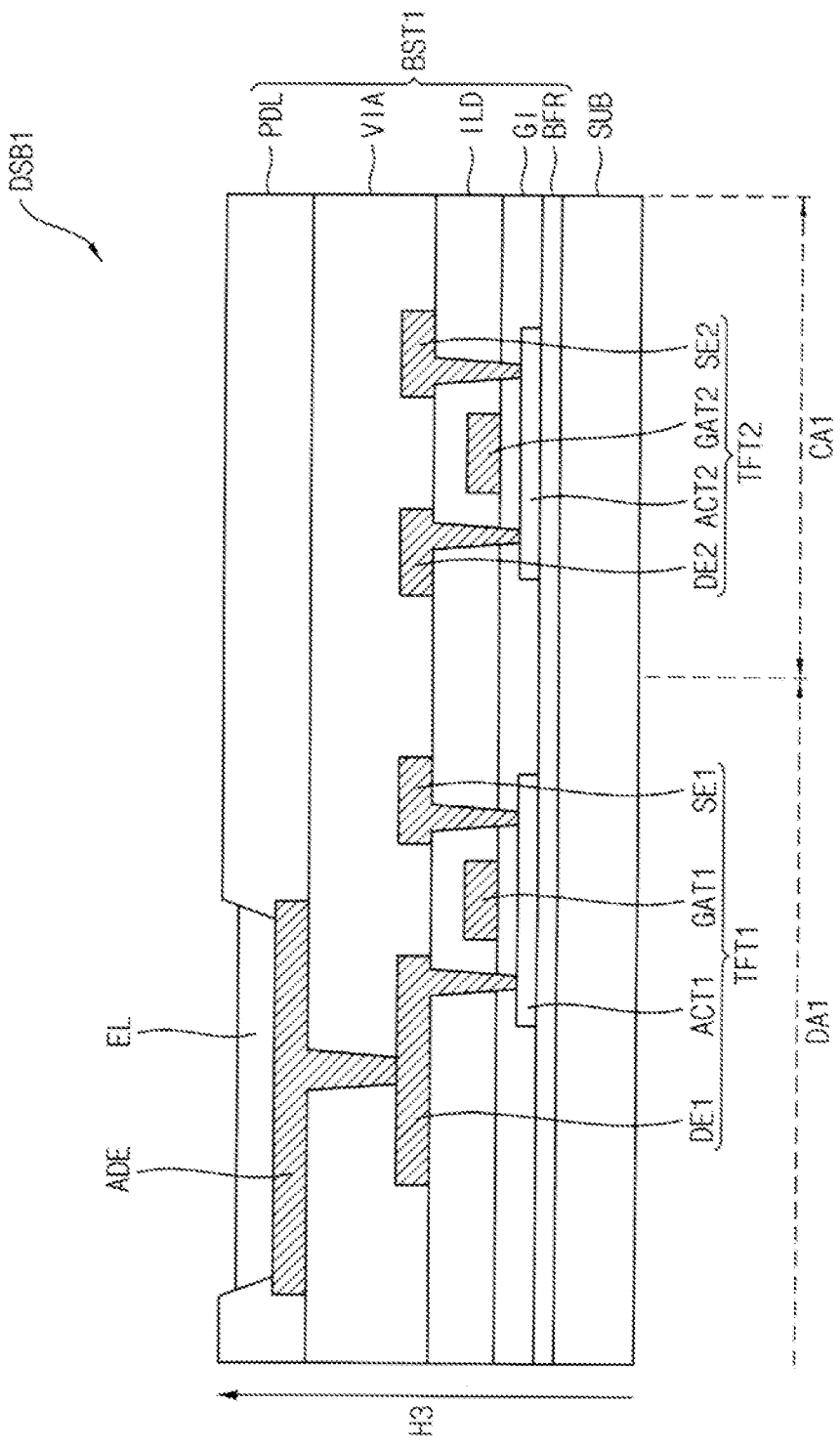
FIGS. 4 and 5 are cross-sectional views of a deposition apparatus of FIG. 1.
Figure 5:
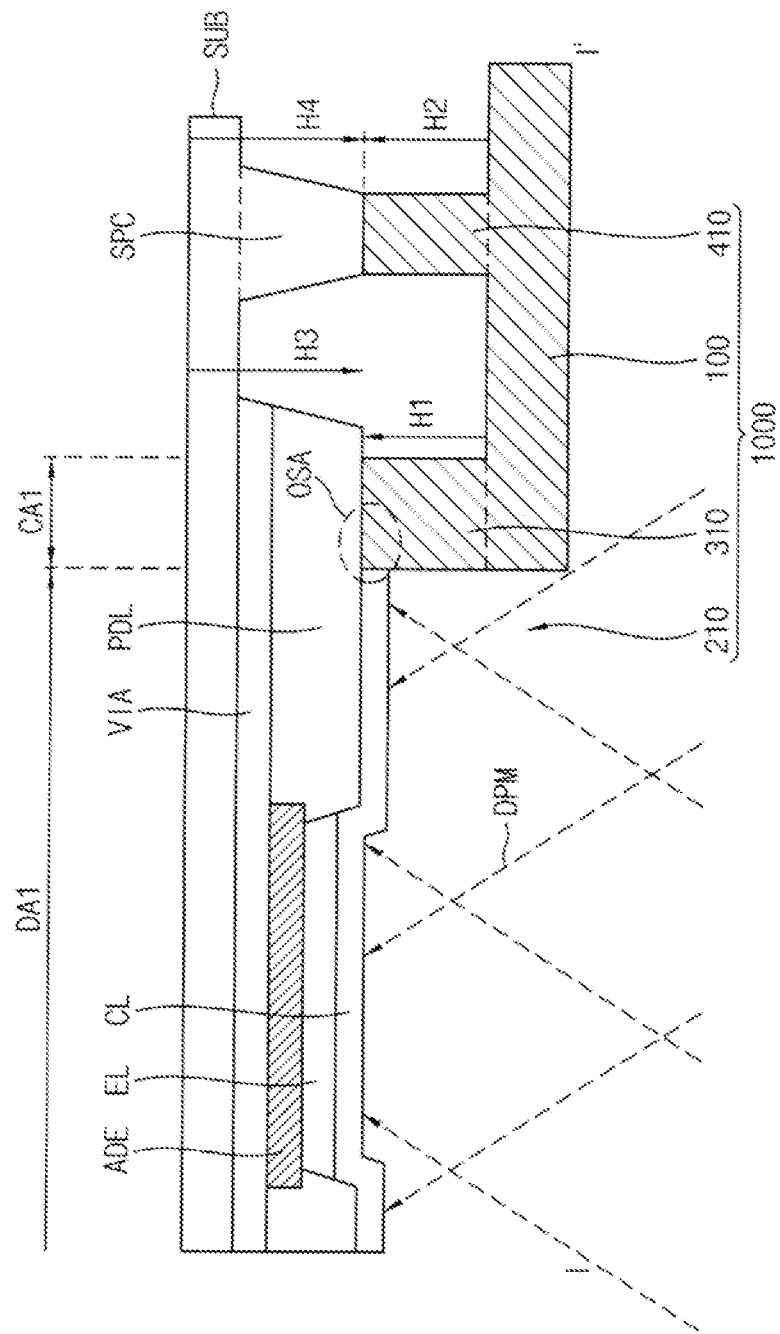

FIGS. 4 and 5 are cross-sectional views illustrating an example of the deposition apparatus of FIG. 1. For example, FIG. 5 is a cross-sectional view illustrating an example taken along line I-I' of FIG. 3.

Referring to FIGS. 4 and 5, in an embodiment, a common layer CL is deposited on a first display substrate DSB1, and the deposition material DPM is a material that forms the common layer CL. For example, the common layer CL may be any one of an electron injection layer, an electron transport layer, a hole injection layer, or a hole transport layer. Hereinafter, a case where the common layer CL is an electron injection layer disposed on an emission layer EL will be described.

In an embodiment, the first display substrate DSB1 includes a base substrate SUB, a first lower structure BST1 disposed on the base substrate SUB, and a spacer SPC that protrudes from the base substrate SUB. The first lower structure BST1 includes a buffer layer BFR, a first active pattern ACT1, a second active pattern ACT2, a gate insulating layer GI, a first gate electrode GAT1, a second gate electrode GAT2, an interlayer insulating layer ILD, a first source electrode SE1, a first drain electrode DE1, a second source electrode SE2, a second drain electrode DE2, a via insulating layer VIA, a first electrode ADE, a pixel defining layer PDL, and the emission layer EL.

In an embodiment, the base substrate SUB may include glass, quartz, or plastic, etc. For example, the base substrate SUB is a plastic substrate and includes polyimide ("PI"). As described above, the first display area DA1 and the first circuit area CA1 adjacent to the first display area DA1 are defined in the base substrate SUB.

In an embodiment, the buffer layer BFR is disposed on the base substrate SUB. The buffer layer BFR may include silicon oxide, silicon nitride, or silicon oxynitride, etc. The buffer layer BFR prevents impurities from diffusing into the first and second active patterns ACT1 and ACT2.

In an embodiment, the first active pattern ACT1 overlaps the first display area DA1 and is disposed on the buffer layer BFR. The first active pattern ACT1 may include a silicon semiconductor or an oxide semiconductor, etc. The silicon semiconductor may be amorphous silicon or polycrystalline silicon, etc. The first active pattern ACT1 conducts a current or blocks a current according to a gate signal provided to the first gate electrode GAT1.

In an embodiment, the second active pattern ACT2 overlaps the first circuit area CA1 and is disposed on the buffer layer BFR. The second active pattern ACT2 conducts a current or blocks a current according to a gate signal provided to the second gate electrode GAT2.

In an embodiment, the gate insulating layer GI is disposed on the buffer layer BFR, includes an insulating material and covers the first and second active patterns ACT1 and ACT2. The gate insulating layer GI may include silicon oxide, silicon nitride, titanium oxide, or tantalum oxide, etc.

In an embodiment, the first gate electrode GAT1 is disposed on the gate insulating layer GI and overlaps the first display area DA1. In an embodiment, the first gate electrode GAT1 may include a metal, an alloy, or a conductive metal oxide, etc. For example, the first gate electrode GAT1 may include silver ("Ag"), an alloy that contains silver, molybdenum ("Mo"), an alloy that contains molybdenum, aluminum ("Al"), an alloy that contains aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), or indium zinc oxide ("IZO"), etc.

In an embodiment, the second gate electrode GAT2 is disposed on the gate insulating layer GI and overlaps the first circuit area CA1. In an embodiment, the second gate electrode GAT2 is formed together with and from the same materials as the first gate electrode GAT1.

In an embodiment, the interlayer insulating layer ILD is disposed on the gate insulating layer GI, includes an insulating material and covers the first and second gate electrodes GAT1 and GAT2. For example, the interlayer insulating layer ILD may include silicon oxide, silicon nitride, titanium oxide, or tantalum oxide, etc.

In an embodiment, the first source electrode SE1 and the first drain electrode DE1 are disposed on the interlayer insulating layer ILD and overlap the first display area DA1. The first source electrode SE1 and the first drain electrode DE1 contact the first active pattern ACT1. In an embodiment, the first source electrode SE1 and the first drain electrode DE1 may include a metal, an alloy, or a conductive metal oxide. For example, the first source electrode SE1 and the first drain electrode DE1 may include silver ("Ag"), an alloy that contains silver, molybdenum ("Mo"), an alloy that contains molybdenum, aluminum ("Al"), an alloy that contains aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), or indium zinc oxide ("IZO"), etc.

In an embodiment, the second source electrode SE2 and the second drain electrode DE2 are disposed on the interlayer insulating layer ILD and overlap the first circuit area CA1. The second source electrode SE2 and the second drain electrode DE2 contact the second active pattern ACT2. In an embodiment, the second source electrode SE2 and the second drain electrode DE2 are formed together with and from the same materials as the first source electrode SE1 and the first drain electrode DE1.

In an embodiment, the first active pattern ACT1, the first gate electrode GAT1, the first source electrode SE1, and the first drain electrode DE1 constitute a first transistor TFT1. In other words, the first transistor TFT1 is disposed on the base substrate SUB and overlaps the first display area DA1. The first transistor TFT1 may be referred to as a pixel transistor that constitutes a pixel. For example, the first transistor TFT1 provides a driving current to the first electrode ADE.

In an embodiment, the second active pattern ACT2, the second gate electrode GAT2, the second source electrode SE2, and the second drain electrode DE2 constitute a second transistor TFT2. In other words, the second transistor TFT2 is disposed on the base substrate SUB and overlaps the first circuit area CA1. The second transistor TFT2 may be referred to as a driving transistor that drives a pixel. For example, the second transistor TFT2 provides a gate signal or a data voltage to the first transistor TFT1.

In an embodiment, the via insulating layer VIA is disposed on the interlayer insulating layer ILD and covers the first source electrode SE1, the first drain electrode DE1, the second source electrode SE2, and the second drain electrode DE2. In an embodiment, the via insulating layer VIA includes an organic insulating material and has a substantially flat top surface. For example, the via insulating layer VIA may include a photoresist, a polyacrylic resin, a polyimide resin, or an acrylic resin.

In an embodiment, the first electrode ADE is disposed on the via insulating layer VIA and overlaps the first display area DA1. The first electrode ADE may include a metal, an alloy, or a conductive metal oxide, etc. For example, the first electrode ADE may include silver ("Ag"), an alloy that contains silver, molybdenum ("Mo"), an alloy that contains molybdenum, aluminum ("Al"), an alloy that contains aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), or indium zinc oxide ("IZO").

In an embodiment, the pixel defining layer PDL is disposed on the via insulating layer VIA, and has an opening that exposes an upper surface of the first electrode ADE. The pixel defining layer PDL may include an organic material such as a polyimide resin, such as a photosensitive polyimide resin ("PSPI"), a photoresist, a polyacrylic resin, or an acrylic resin, or may include inorganic material such as silicon oxide or silicon nitride.

In an embodiment, the emission layer EL is disposed on the first electrode ADE and overlaps the first display area DA1. In an embodiment, a hole injection layer and/or a hole transport layer is further disposed between the first electrode ADE and the emission layer EL, and an electron transport layer is further disposed on the emission layer EL.

In an embodiment, the emission layer EL is disposed inside the opening, and the first blocking portion 310 contacts the pixel defining layer PDL. A top surface of the pixel defining layer PDL that is opposite to and furthest from the base substrate SUB is a third height H3 from the base substrate SUB. In other words, the third height is a height of the first lower structure BST1 with respect to the base substrate SUB.

In an embodiment, the spacer SPC is disposed on the base substrate SUB. For example, the spacer SPC is formed together with the via insulating layer VIA and/or the pixel defining layer PDL. In an embodiment, the spacer SPC protrudes from the base substrate SUB. Accordingly, the spacer SPC contacts the first support portion 410. For example, a top surface of the spacer SPC that is opposite to and furthest from the base substrate SUB is a fourth height H4 from the base substrate SUB.

As shown in FIG. 5, in an embodiment, the deposition material DPM is deposited on the first display substrate DSB1 using the deposition mask 1000.

In an embodiment, the first blocking portion 310 protrudes from the body portion 100 by a first height H1 and contacts the pixel defining layer PDL. The first support portion 410 protrudes from the body portion 100 by a second height H2 and contacts the spacer SPC. A sum of the first height H1 and the third height H3 is equal to a sum of the second height H2 and the fourth height H4. In addition, the first height H1 is equal to the second height H2.

A conventional deposition mask does not include the first blocking portion 310. Accordingly, the deposition material. DPM may be deposited outside of the first pattern portion 210. Since the deposition material DPM deposited outside of the first pattern portion 210 is deposited on the first circuit area CA1 adjacent to the first display area DA1, an external shadow is formed in an external shadow area OSA. Accordingly, a process margin that corresponds to the external shadow is formed in the first circuit area CA1 of a conventional first display substrate, which increases a size of the bezel of the display device.

However, the deposition mask 1000 according to an embodiment of the present disclosure includes the first blocking portion 310 that contacts the first display substrate DSB1. Accordingly, the deposition material DPM is blocked by the first blocking portion 310 and not deposited outside of the first pattern portion 210. Accordingly, no external shadow is formed, and there is no external shadow area OSA. Therefore, no process margin is needed in the first circuit area CA1 of the first display substrate DSB1 manufactured using the deposition mask 1000, and the bezel of the display device can be reduced.

In addition, in an embodiment, the first support portion 410 is adjacent to the first blocking portion 310, contacts the spacer SPC, and supports the first display substrate DSB1 together with the first blocking part 310. Accordingly, pressure applied to the first circuit area CA1 that overlaps the first blocking portion 310 can be reduced. Accordingly, components, such as the second transistor TFT2, disposed in the first circuit area CA1 will not be damaged. In addition, adjusting the fourth height H4 of the spacer SPC adjusts the pressure applied to the circuit area CA1.

Figure 6:
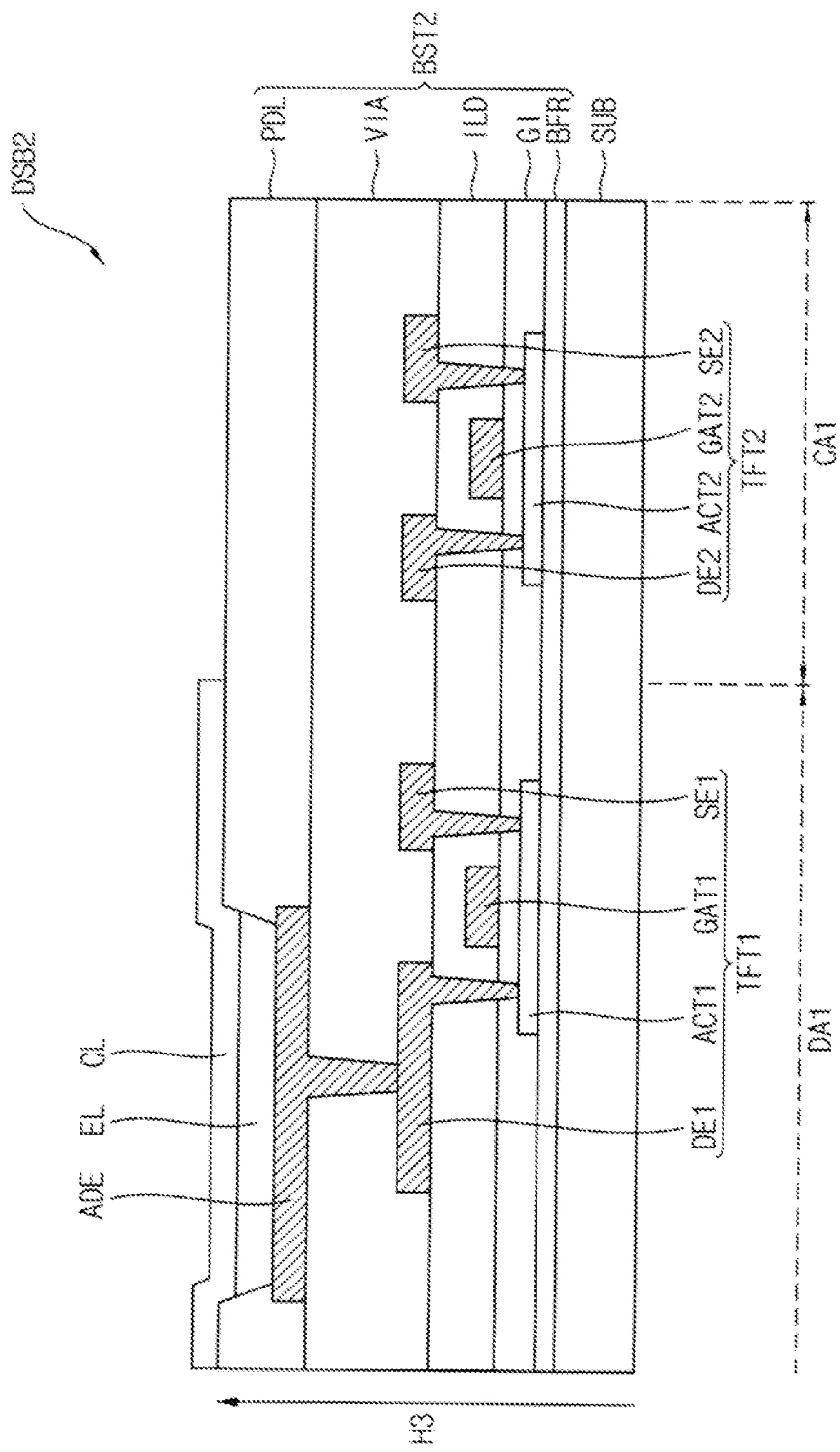
FIGS. 6 and 7 are cross-sectional views of another deposition apparatus of FIG. 1.
Figure 7:
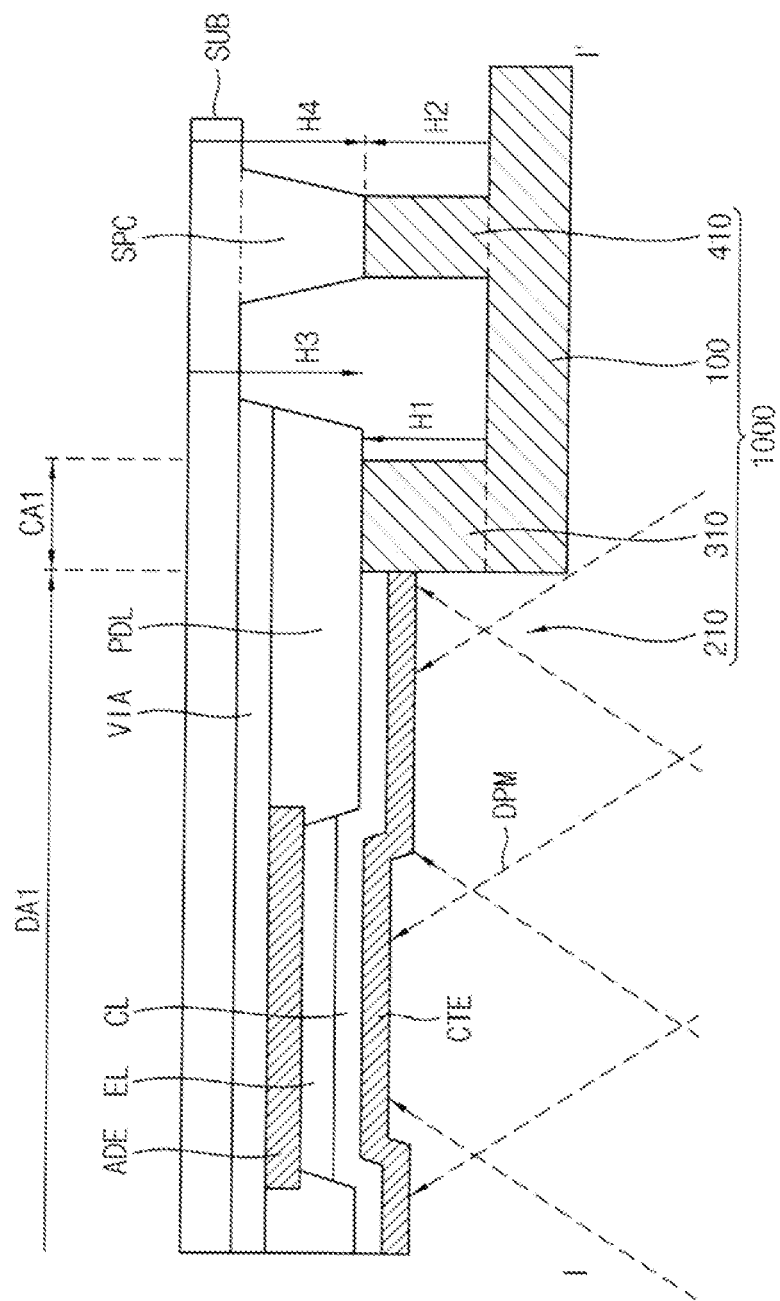

FIGS. 6 and 7 are cross-sectional views of another deposition apparatus of FIG. 1. For example, FIG. 7 is a cross-sectional view of another example taken along line I-I' of FIG. 3.

Referring to FIGS. 6 and 7, in an embodiment, a second electrode CTE is deposited on a second display substrate DSB2, and the deposition material DPM is a material that forms the second electrode CTE. For example, the first electrode ADE is an anode electrode of the organic light emitting diode, and the second electrode CTE is a cathode electrode of the organic light emitting diode.

In an embodiment, the second display substrate DSB2 includes a base substrate SUB, a second lower structure BST2 disposed on the base substrate SUB, and a spacer SPC that protrudes from the base substrate SUB. The second lower structure BST2 includes the buffer layer BFR, the first active pattern ACT1, the second active pattern ACT2, the gate insulating layer GI, the first gate electrode GAT1, the second gate electrode GAT2, the interlayer insulating layer ILD, the first source electrode SE1, the first drain electrode DE1, the second source electrode SE2, the second drain electrode DE2, the via insulating layer VIA, the first electrode ADE, the pixel defining layer PDL, the emission layer EL, and the common layer CL. For example, the second display substrate DSB2 on which the second electrode CTE is formed is substantially the same as the first display substrate DSB1.

In an embodiment, the second electrode CTE may include a metal, an alloy, or a conductive metal oxide, etc. For example, the deposition material DPM that forms the second electrode CTE may include silver ("Ag"), an alloy that contains silver, molybdenum ("Mo"), an alloy that contains molybdenum, aluminum ("Al"), alloys that contain aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), or indium zinc oxide ("IZO").

FIG. 8 is a plan view of another deposition mask included in a deposition apparatus of FIG. 1. For example, FIG. 8 illustrating one of several shapes that a deposition mask in the deposition apparatus of FIG. 1 may have.

Referring to FIG. 8, in an embodiment, a deposition mask 2000 includes the body portion 100, a plurality of pattern portions, a plurality of blocking portions, and a plurality of support portions. For example, the deposition mask 2000 includes the body portion 100, a first pattern portion 211, a second pattern portion 221, a first blocking portion 311, a second blocking portion 321, a first support portion 411, and a second support portion 421. However, the deposition mask 2000 is substantially the same as the deposition mask 1000 described with reference to FIG. 3 except for the shapes of the first pattern portion 211, the second pattern portion 221, the first blocking portion 311, the second blocking portion 321, the first support portion 411, and the second support portion 421.

In an embodiment, the first pattern portion 211 may have a circular or elliptical shape. For example, when a shape of the first deposition area is elliptical, the first pattern portion 211 has an elliptical shape that corresponds to the shape of the first deposition area. The second pattern portion 221 is spaced apart from the first pattern portion 211 and has a shape that is substantially the same shape as a shape of the first pattern portion 211.

In an embodiment, the first blocking portion 311 defines the first pattern portion 211. For example, the first blocking portion 311 surrounds the first pattern portion 211. The first blocking portion 311 has a shape that corresponds to the shape of the first pattern portion 211. For example, as shown in FIG. 8, the first blocking portion 311 may have an elliptical or circular shape. The second blocking portion 321 is spaced apart from the first blocking portion 311 and has substantially the same shape as that of the first blocking portion 311.

In an embodiment, the first support portion 411 is disposed between the first blocking portion 311 and the second blocking portion 321. In addition, the second support portion 421 is disposed between the first support portion 411 and the second blocking portion 321. The first support portion 411 is disposed along and conforms to the curvature of the first blocking portion 311. The second support portion 421 is disposed along and conforms to the curvature of the second blocking portion 321.

Figure 9:
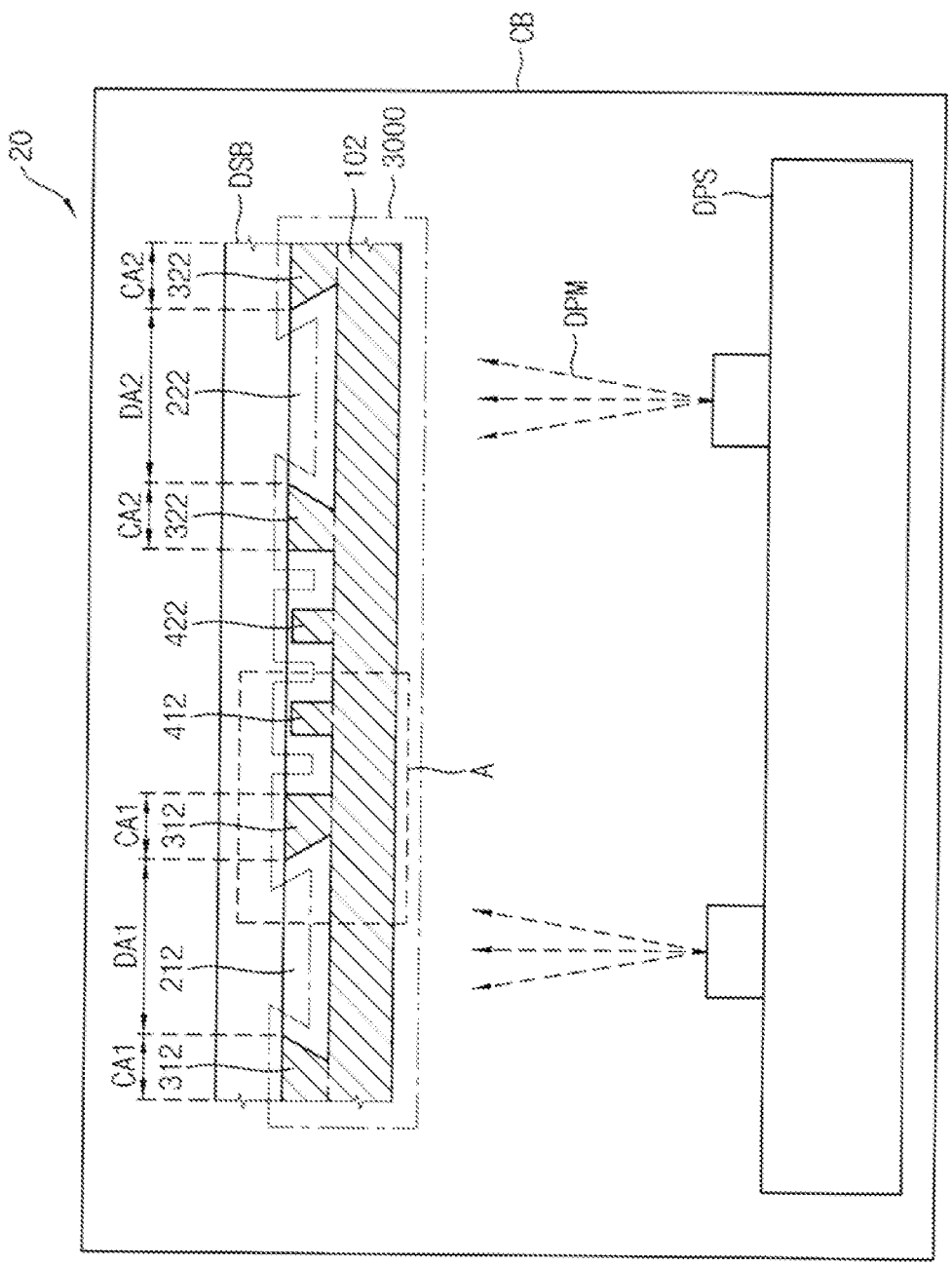
FIG. 9 is a cross-sectional view of a deposition apparatus according to an embodiment.
Figure 10:
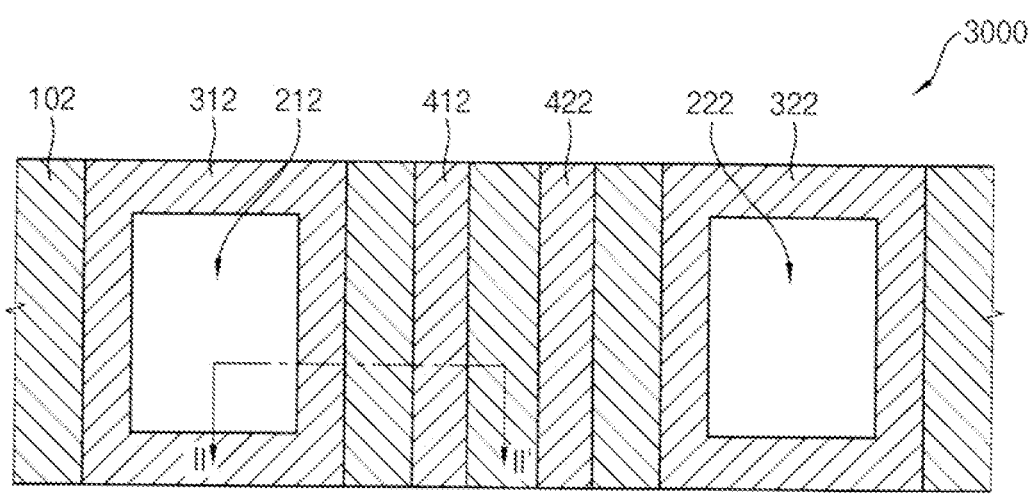
FIG. 10 is a plan view of a deposition mask in a deposition apparatus of FIG. 9.
Figure 11:
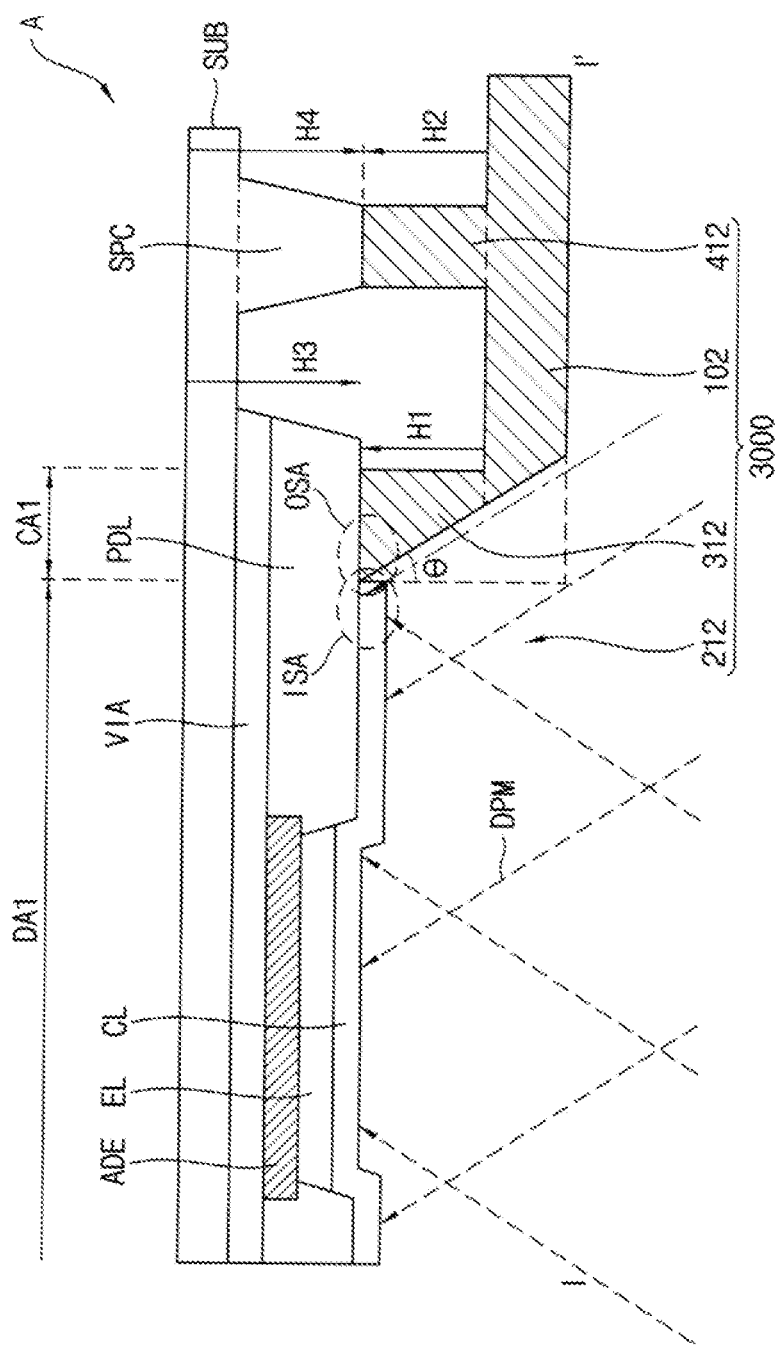
FIG. 11 is an enlarged view of an area A of FIG. 9.

FIG. 9 is a cross-sectional view of a deposition apparatus according to an embodiment. FIG. 10 is a plan view of a deposition mask in a deposition apparatus of FIG. 9. FIG. 11 is an enlarged view of an area A of FIG. 9. For example, FIG. 11 is a cross-sectional view taken along line I of FIG. 9.

Referring to FIGS. 9 and 10, a deposition apparatus 20 according to an embodiment of the present disclosure includes a chamber CB, a deposition mask 3000, and a deposition source DPS. However, the chamber CB and the deposition source DPS are substantially the same as the chamber CB and the deposition source DPS described with reference to FIG. 1.

In an embodiment, the deposition mask 3000 is disposed inside the chamber CB. Some of the deposition material DPM can pass through the deposition mask 3000. In other words, the deposition mask 3000 partially blocks the deposition material DPM. Accordingly, the deposition material DPM is partially deposited on the display substrate DSB by the deposition source DPS through the deposition mask 3000. The display substrate DSB is substantially the same as the display substrate DSB described with reference to FIG. 1.

In an embodiment, the deposition mask 3000 includes a body portion 102, a plurality of pattern portions, a plurality of blocking portions, and a plurality of support portions. For example, the deposition mask 3000 may include the body portion 102, a first pattern portion 212, a second pattern portion 222, a first blocking portion 312, a second blocking portion 322, a first support portion 412, and a second support portion 422. The first and second pattern portions 212 and 222 penetrate the body portion 102 and pass the deposition material DPM. Accordingly, the deposition mask 3000 functions as an open mask. However, except for shapes of the body portion 102, the first pattern portion 212, the second pattern portion 222, the first blocking portion 312, the second blocking portion 322, the first support portion 412, and the second support portion 422, the deposition mask 3000 is substantially the same as the deposition mask 1000, and a duplicate description will be omitted.

Referring to FIGS. 9, 10, and 11, in an embodiment, the body portion 102 is a skeleton of the deposition mask 3000. In an embodiment, the body portion 102 faces the display substrate DSB and is spaced apart from the display substrate DSB. The body portion 102 blocks the deposition material DPM.

In an embodiment, the body portion 102 includes a rigid metal. For example, the body portion 102 may include at least one of stainless steel ("SUS"), Invar alloy, nickel ("Ni"), cobalt ("Co"), a nickel alloy, or a nickel-cobalt alloy.

In an embodiment, the first pattern portion 212 penetrates the body portion 102. Accordingly, the deposition material DPM passes through the first pattern portion 212. In other words, the first pattern portion 212 passes the deposition material DPM. In an embodiment, the first pattern portion 212 defines a first deposition area in the display substrate DSB in which the deposition material DPM is deposited. For example, the first deposition area is the first display area DA1. In other words, the first pattern portion 212 overlaps the first display area DA1. In addition, as the body portion 102 and the first blocking portion 312 have tapered sidewalls, the first pattern portion 212 further overlaps at least a portion of the first circuit area CA1.

In an embodiment, the second pattern portion 222 is spaced apart from the first pattern portion 212 and has a shape that is substantially the same as the shape of the first pattern portion 212.

In an embodiment, the first blocking portion 312 is disposed on the body portion 102. For example, the first blocking portion 312 protrudes from the body portion 102. In an embodiment, the first blocking portion 312 contacts the display substrate DSB. For example, the first blocking portion 312 contacts the first circuit area CA1 of the display substrate DSB.

In an embodiment, the first blocking portion 312 is integrally formed with the body portion 102. For example, the first blocking portion 312 includes at least one of stainless steel ("SUS"), Invar alloy, nickel ("Ni"), cobalt ("Co"), a nickel alloy, or a nickel-cobalt alloy.

In an embodiment, the first blocking portion 312 defines the first pattern portion 212. For example, the first blocking portion 312 surrounds the first pattern portion 212. The first blocking portion 312 has a shape that corresponds to the shape of the first pattern portion 212.

In an embodiment, as shown in FIG. 11, the first blocking portion 312 and the body portion 102 that overlaps the first blocking portion 312 have a tapered shape, i.e., tapered sidewalls. Accordingly, an entrance area of the first pattern portion 212 is increased. For example, a taper angle θ is an angle between the first blocking portion 312 and a direction perpendicular to the display substrate DSB. The taper angle θ corresponds to an incident angle of the deposition material DPM.

In an embodiment, as the first blocking portion 312 and the body portion 102 that overlaps the first blocking portion 312 have tapered sidewalls, the deposition material DPM is more evenly deposited on the first display area DA1 adjacent to the first circuit area CA1.

In detail, in an embodiment, the first display area DA1 includes an inner shadow area ISA adjacent to the first circuit area CA1. For example, when no tapered sidewall is formed in the first blocking portion and the body portion that overlaps the first blocking portion, a portion of the deposition material DPM that is directed toward the inner shadow area ISA is blocked by the blocking portion and the body portion. Accordingly, the concentration of the deposition material DPM deposited in the inner shadow area ISA is relatively reduced, and an inner shadow is formed in the inner shadow area ISA.

However, in the deposition mask 3000 according to an embodiment, as the first blocking portion 312 and the body portion 102 that overlap the first blocking portion 312 have tapered sidewalls, the concentration of the deposition material DPM directed to the inner shadow area ISA is increased. Accordingly, no inner shadow is formed in the inner shadow area ISA.

The deposition apparatuses 10 and 20 according to embodiments of the present disclosure may include deposition masks 1000, 2000, and 3000, and each of the deposition masks 1000, 2000, and 3000 includes a body portion, pattern portions that penetrate the body portion, blocking portions that protrude from the body portion, and support portions adjacent to the blocking portions. The blocking portions define the pattern portions, and the blocking portions and the support portions contact the display substrate.

As the blocking portions contact the display substrate, a deposition material directed outside of the pattern portion is blocked. Accordingly, no external shadow is formed. Accordingly, a display substrate according to an embodiment does not have a process margin that corresponds to the external shadow, and the bezel of the display device can be reduced.

In addition, according to embodiments, as the blocking portions have tapered sidewalls, the concentration of the deposition material deposited toward the pattern portion is evenly distributed. Accordingly, no inner shadow is formed.

In addition, as the support portions support the display substrate together with the blocking portions, pressure applied to the display substrate is dispersed. For example, pressure applied to the display substrate that contacts the blocking portions is reduced. Accordingly, components disposed on the display substrate are not damaged, and a yield of the display substrate is improved.

Although embodiments have been described herein, other embodiments and modifications will be apparent from this description. Therefore, the disclosure is not limited to such embodiments, but rather to the broader scope of the appended claims and various obvious modifications and equivalent arrangements as would be apparent to a person of ordinary skill in the art.

What is claimed is:

1. A deposition mask, comprising:
a body portion;
a pattern portion that penetrates the body portion and is configured to allow deposition material to pass through the body portion;
a blocking portion disposed on the body portion, wherein the blocking portion contacts a display substrate, blocks the deposition material, and defines the pattern portion, wherein the blocking portion is integrally formed with and protrudes upward perpendicular to a plane from the body portion; and
a support portion disposed on the body portion and adjacent to the blocking portion, wherein the support portion contacts the display substrate.

2. The deposition mask of claim 1, wherein the blocking portion surrounds the pattern portion.

3. The deposition mask of claim 1, wherein the deposition material is not deposited on a portion of the display substrate that overlaps the blocking portion.

4. The deposition mask of claim 1, wherein the blocking portion and the body portion that overlaps the blocking portion have a tapered sidewall.

5. The deposition mask of claim 1, wherein each of the blocking portion and the body portion comprises a metal selected from a group consisting of stainless steel ("SUS"), Invar alloy, nickel ("Ni"), cobalt ("Co"), a nickel alloy, or a nickel-cobalt alloy.

6. The deposition mask of claim 1, wherein the support portion supports the display substrate together with the blocking portion.

7. The deposition mask of claim 1, wherein the display substrate includes a base substrate, a lower structure disposed on the base substrate, and a spacer that protrudes from the base substrate, and wherein the support portion contacts the spacer.

8. The deposition mask of claim 7, wherein a first height of the blocking portion is equal to a second height of the support portion.

9. The deposition mask of claim 8, wherein a sum of the first height and a third height from the base substrate to the lower structure is equal to a sum of the second height and a fourth height of the spacer.

10. The deposition mask of claim 1, wherein the support portion is integrally formed with and protrudes upward perpendicular to a plane from the body portion and the blocking portion.

11. The deposition mask of claim 10, wherein each of the support portion, the body portion and the blocking portion comprises a metal selected from a group consisting of stainless steel ("SUS"), Invar alloy, nickel ("Ni"), cobalt ("Co"), a nickel alloy, or a nickel-cobalt alloy.

* * * * *